United States Patent [19]
Nagaishi

[11] Patent Number: 5,291,425
[45] Date of Patent: Mar. 1, 1994

[54] TEST MODE SETTING ARRANGEMENT FOR USE IN MICROCOMPUTER

[75] Inventor: Hatsuhiro Nagaishi, Tokyo, Japan

[73] Assignee: NEC Corporation, Tokyo, Japan

[21] Appl. No.: 800,512

[22] Filed: Nov. 29, 1991

[30] Foreign Application Priority Data

Nov. 28, 1990 [JP] Japan .................................. 2-327923

[51] Int. Cl.⁵ .......................................... G01N 27/00
[52] U.S. Cl. .................... 364/570; 364/579; 395/425; 395/725; 371/22.5; 371/22.6
[58] Field of Search ............ 371/16.1, 16.3, 22.5, 371/22.6; 395/725, 425, 775, 575; 364/579, 580, 570; 324/73.1

[56] References Cited

U.S. PATENT DOCUMENTS

| | | | |
|---|---|---|---|
| 3,893,084 | 7/1975 | Kotok et al. | 395/425 |
| 4,171,536 | 10/1979 | Heuer et al. | 395/425 |
| 4,586,180 | 4/1986 | Anders et al. | 371/16.3 |
| 4,677,586 | 6/1987 | Magar et al. | 364/900 |
| 4,833,629 | 5/1989 | Moore | 395/775 |
| 4,905,142 | 2/1990 | Matsubara et al. | 395/425 |
| 4,967,387 | 10/1990 | Shibasaki et al. | 371/16.1 |
| 5,012,185 | 4/1991 | Ohfuji | 371/22.6 |
| 5,086,505 | 2/1992 | Goldberg et al. | 395/775 |
| 5,103,167 | 4/1992 | Ohano et al. | 371/22.5 |

FOREIGN PATENT DOCUMENTS

| | | |
|---|---|---|
| 0127440 | 5/1984 | European Pat. Off. |
| 0322856 | 7/1989 | European Pat. Off. |
| 0437387 | 7/1991 | European Pat. Off. |

*Primary Examiner*—Jack B. Harvey
*Assistant Examiner*—Hal D. Wachsman
*Attorney, Agent, or Firm*—Whitham & Marhoefer

[57] ABSTRACT

A test mode setting arrangement provided in a microcomputer includes an internal memory, a plurality of pins and a central processing unit, the central processing unit being allowed to access the internal memory or an external memory depending on a logic level of a mode signal applied to the microcomputer, the arrangement basically features: a first unit for resetting the central processing unit in response to a reset control signal applied thereto, the reset control signal and the mode signal exhibiting essentially the same maximum voltage; a second unit for changing the output thereof in response to the logic level change of the mode signal, the second unit issuing an output which is applied to the central processing unit as a test mode initiating signal; and a third unit coupled to receive the mode signal and the output of the second unit, the third unit producing two signals which selects the access of the central processing unit to one of the internal and external memories.

13 Claims, 7 Drawing Sheets

TEST MODE SETTING ARRANGEMENT FOR USE IN MICROCOMPUTER

BACKGROUND OF THE INVENTION

1. Field of the Invention

The present invention relates generally to a test mode setting arrangement provided within a microcomputer, and more specifically to such an arrangement which obviates the need for a pin or terminal to be dedicated to testing.

2. Description of the Prior Art

It is a common practice that a manufacturer of microcomputers provides each of the fabricated chips with a test mode setting arrangement or circuit for effectively ascertaining whether a chip has been manufactured correctly or not. Functional testing is usually performed using a LSI (Large Scale Integration) tester which applies a test pattern to a microcomputer input(s) and compares the output(s) therefrom with expected values.

Before turning to the present invention it is deemed preferable to briefly discuss two known test mode setting arrangements with reference to FIGS. 1 and 2.

FIG. 1 is a block diagram showing a microcomputer 10 which includes a known test mode setting arrangement 12, a CPU (Central Processing Unit) 14, an internal memory 16 and a test memory 18. The memories 16, 18 are coupled to the CPU 14 by way of an address bus 17 and an instruction fetch bus 19. For the sake of simplifying the description and drawings, the microcomputer 10 shown in FIG. 1 does not illustrate all of the circuits usually included therein. An external memory 20 is coupled to the CPU 14 through chip pins P4, P5 via address buses 17, 17' and instruction fetch buses 19, 19'.

Before describing the test modes of the FIG. 1 arrangement, two instruction fetch modes will be described.

It is assumed that a test signal 41 applied to a pin P3 assumes a logic 0. If a mode select signal 42 applied to a pin P1 assumes a logic 0, the AND gate 28 issues an instruction fetch mode (IFM) signal IFM 1 assuming a logic 1 while another instruction fetch mode signal IFM 2 from the AND gate 30 assumes a logic 0. In response to the signal IFM 1 assuming a logic 1, the CPU 14 fetches instructions from the external memory 20 and executes same. On the other hand, in the event that the mode select signal 42 assumes a logic 1 (e.g., a power source voltage 5 V), the output of AND gate 28 assumes a logic 0 while the output of the AND gate 30 assumes a logic 1. Thus, the CPU fetches instructions stored in the internal memory 16 and executes same. The instruction fetch modes are not directly concerned with the present invention, and hence further descriptions thereof are deemed redundant.

The test mode implemented by the FIG. 1 arrangement will be described in brief. User programs stored in the internal memories of microcomputers vary from user to user and, accordingly, if all of the user programs are to be verified in terms of operations thereof, it is necessary to obtain individual user's input information and prepare the corresponding different test patterns. However, it is practically impossible to obtain the different user's input data and prepare the corresponding test patterns and then execute microcomputer tests. In order to overcome this problem, the test memory 18, which is dedicated to the test mode, is provided within the microcomputer 10. The manufacturer stores a predetermined set of program instructions in the test memory 18. Following this, the instructions are fetched from the memory 18 and executed by the CPU 14 for diagnostic purposes using a single test pattern. Such a test mode using the test memory 18 will be referred to as TEST MODE 1.

The test mode setting arrangement 12 initiates the above-mentioned TEST MODE 1. In FIG. 1, before bringing this test mode into operation, a reset control signal 44 assuming a logic 0 is applied to the reset signal generator 26 via a pin P2 in order to reset the CPU 14. The reset signal generator 26 issues a reset signal 46 which assumes a power source voltage Vcc (viz., logic 1) in response to the reset control signal 44 assuming logic 0. Thus, the CPU 14 is initialized. In this instance, the test signal 41 continues to assume the power source voltage Vcc (viz., logic 1).

After resetting the CPU 14, when the reset control signal 44 is raised to Vcc, the reset signal 46 assumes a logic 0 by which the CPU is released from the reset condition. Thereafter, when the test signal 41 assumes the power source voltage Vcc (viz., logic 1), the CPU 14 initiates TEST MODE 1 in this particular case.

Recent advances in LSI technology have permitted notable reductions in chip size. However, the full benefit of this size reduction capability has not been realized in that the pins, which are inherently required to be provided along the side(s) of the chips, must have a finite size so as to exhibit the required rigidity and longevity. Thus, it is highly desirable to increase the number of pins available for users. Therefore, the prior art discussed with FIG. 1 has encountered the problem in that it is inherently provided with the pin P3 dedicated to the test mode.

FIG. 2 is a block diagram showing another known test mode setting arrangement 12' which does not require a pin exclusively for test mode use. The arrangement 12' of FIG. 2 differs from the counterpart 12 of FIG. 1 in that: (a) the arrangement 12' is not provided with a pin which is dedicated to the testing of a microcomputer and (b) the arrangement 12' includes a high voltage detector 24. The remaining portions of the FIG. 2 arrangement are identical to those of the FIG. 1 arrangement, and hence further descriptions thereof will be omitted for brevity.

The arrangement 12' of FIG. 2 is provided to initiate TEST MODE 1 in the same manner as the arrangement 12 of FIG. 1. In FIG. 2, before initiating TEST MODE 1, a reset signal 44 assuming a logic 0 is applied to the reset signal generator 26 via the pin P2 in order to reset the CPU 14. The reset signal generator 26 issues a reset signal 46 which assumes a power source voltage Vcc (viz., logic 1) in response to the reset signal 44 assuming logic 0 applied thereto. Thus, the CPU 14 is initialized. In this instance, although the high voltage detector 24 is also supplied with the signal 44 assuming 0, the detector 24 issues a signal 40 assuming a logic 0.

After resetting the CPU 14, when the reset signal 44 is raised to a predetermined high voltage (e.g., a voltage of 12 V or more), the high voltage detector 24 produces the test signal 40' assuming a logic 1 (viz., the power voltage Vcc). In this case, each of fetch mode signals IFM1 and IFM2 assumes a logic 0 irrespective of the value of the mode signal 42. Thus, the CPU initiates the TEST MODE 1 in this particular case.

The test mode setting circuit 12' shown in FIG. 2 is such that, while it does not requires a pin or terminal to be exclusively assigned to the test mode, allowing the number of pins available for users to increase, it requires the provision of the high voltage detector 24. This induces the drawbacks that, normal LSI testers must be modified in order to increase the normal output, which is about 8 V, up to the necessary 12 V level, or alternatively replaced with a much more expensive unit. In either event the second prior art increases the cost of microprocessor fabrication.

SUMMARY OF THE INVENTION

It is an object of the present invention to provide a test mode setting circuit of a microcomputer which eliminates the need for a pin to be dedicated to test mode use and which is free of circuit arrangements which demand LSI tester modification.

More specifically a first aspect of the present invention comes in a test mode setting arrangement provided in a microcomputer which includes an internal memory and a central processing unit, the central processing unit being allowed to access the internal memory or an external memory depending on a logic level of a mode signal applied to the microcomputer, comprising: first means for resetting the central processing unit in response to a reset control signal applied thereto; second means for changing the output thereof in response to the logic level change of the mode signal; a flip-flop coupled to be reset by the reset control signal and coupled to receive the output of the second means, the flip-flop issuing an output which is applied to the central processing unit as a test mode initiating signal; and fourth means coupled to receive the mode signal and the output of the flip-flop, the fourth means producing two signals which selects the access of the central processing unit to one of the internal and external memories.

A second aspect of the present invention is a test mode setting arrangement provided in a microcomputer which includes an internal memory and a central processing unit, the central processing unit being allowed to access the internal memory or an external memory depending on a logic level of a mode signal applied to the microcomputer, comprising: first means for resetting the central processing unit in response to a reset control signal applied thereto; a counter being arranged to be reset by the reset control signal and issuing at least two outputs whose logic levels changes in response to the logic level change of the mode signal; and third means coupled to receive the mode signal and the outputs of the counter, the third means producing a plurality of signals which selects one of plural test modes and selects the access of the central processing unit to one of the internal and external memories.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Figure 3:
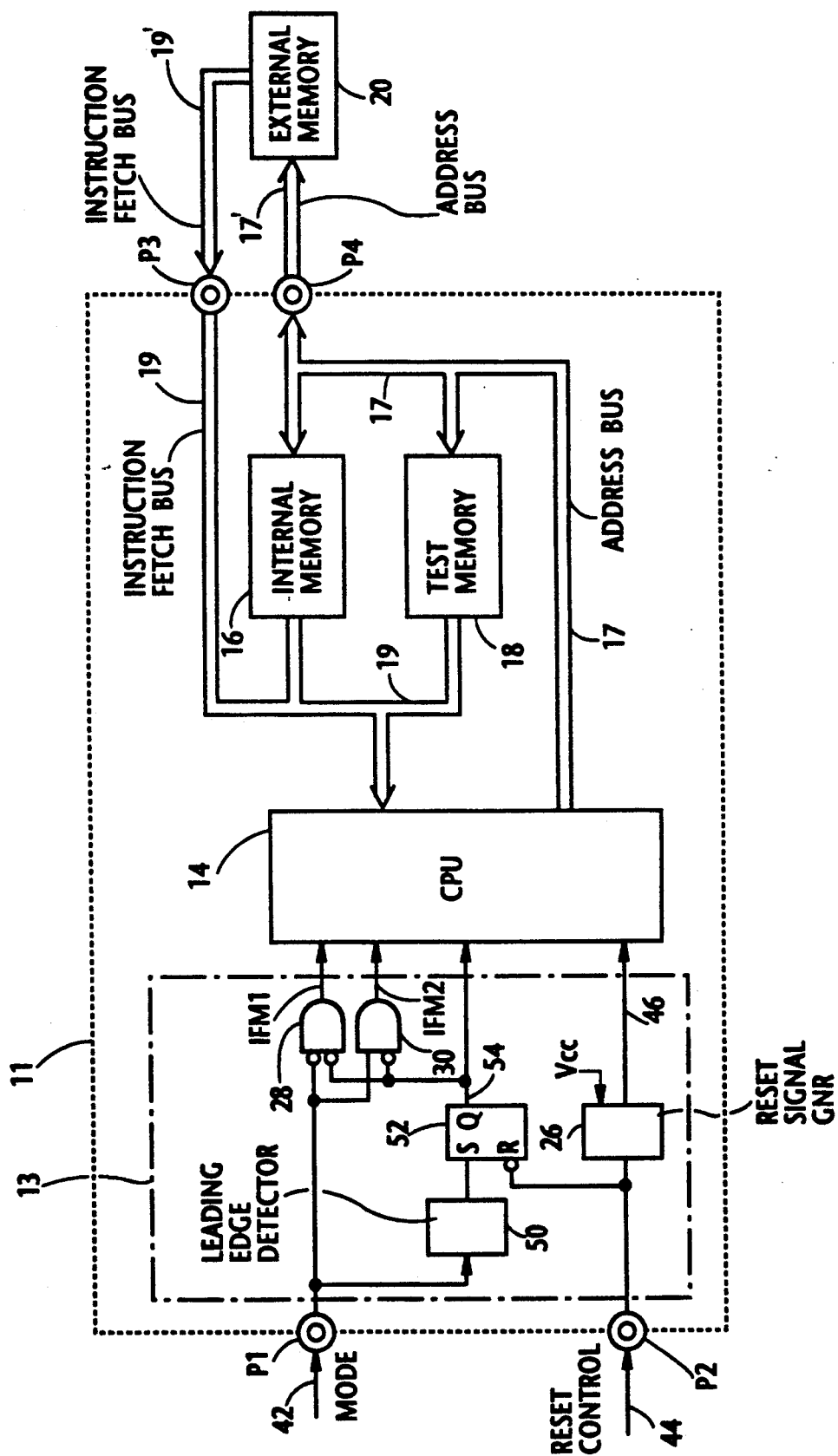
FIG. 3 is a block diagram showing a first embodiment of the present invention.

Reference is now made to FIG. 3 wherein a first embodiment of the present invention is schematically illustrated in block diagram form.

Figure 1:
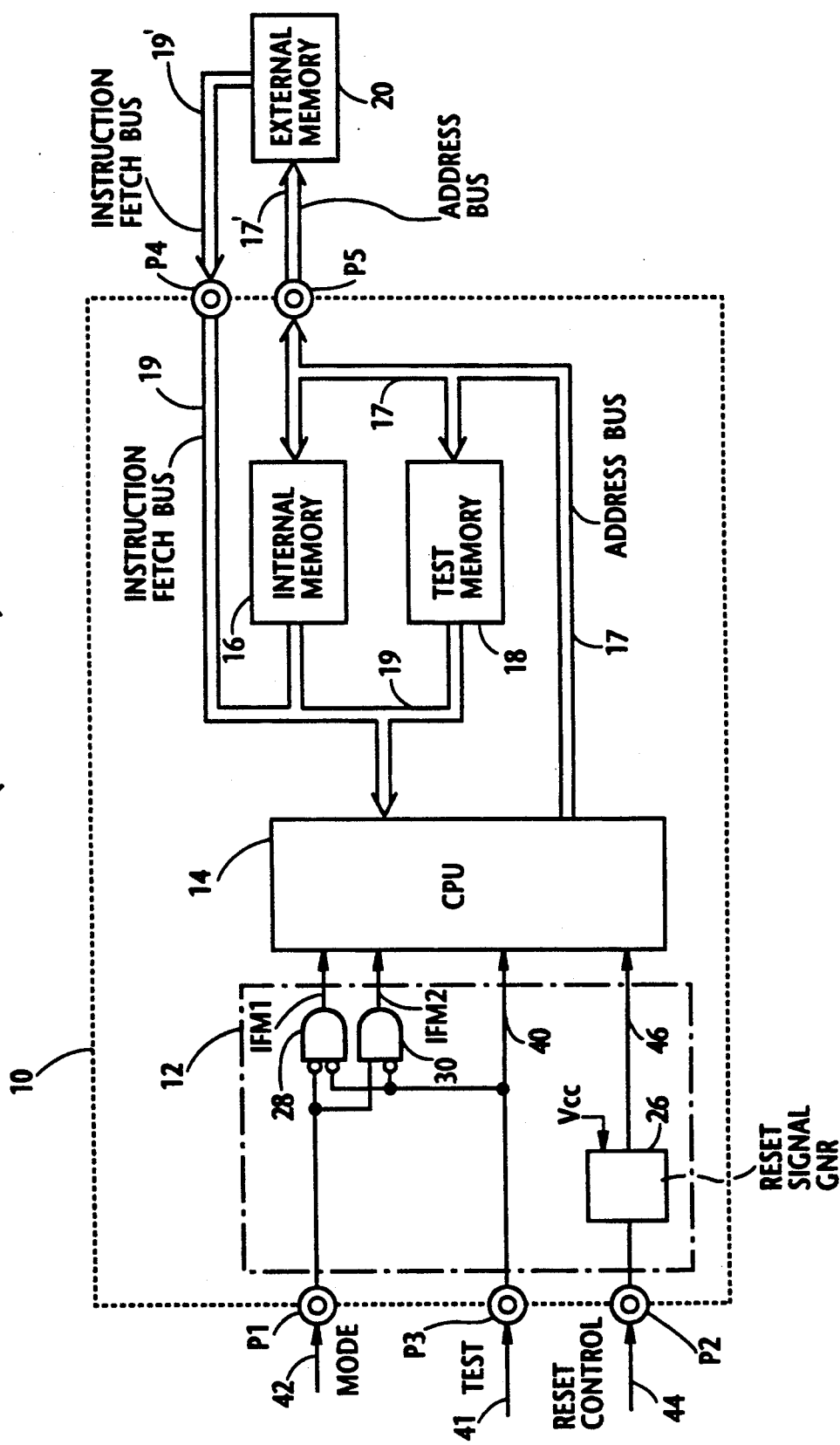
FIGS. 1 and 2 are block diagrams showing the prior art arrangements referred to in the opening paragraphs of the instant disclosure.
Figure 2:
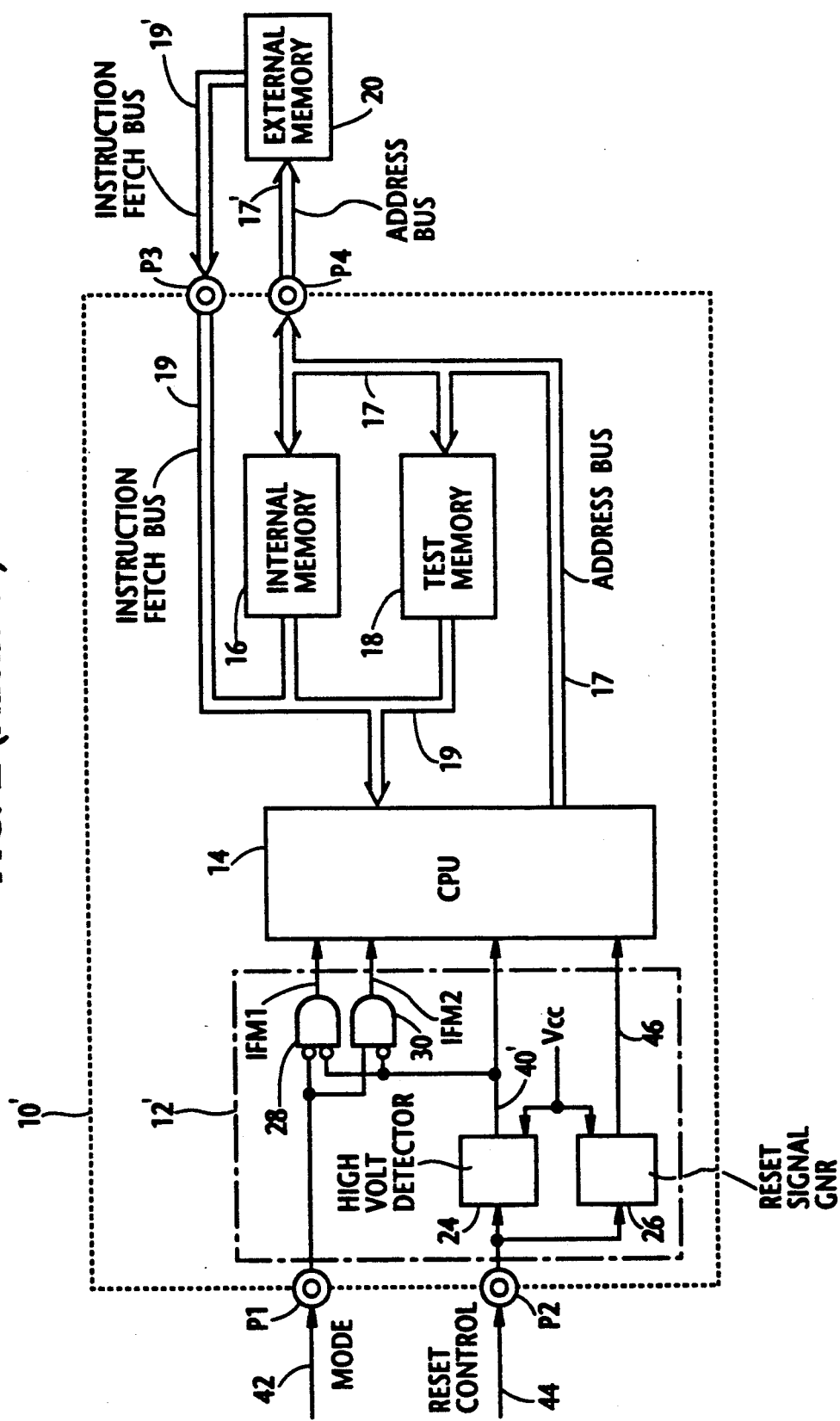

The arrangement of FIG. 3 differs from that of FIG. 2 in that the former arrangement includes a leading edge detector 50 and a RS (Reset-Set) flip-flop 52 in place of the high voltage detector 24 of FIG. 2. The leading edge detector 50 detects a leading edge of a signal applied thereto and produces a pulse which has a pulse width sufficient for setting the RS flip-flop 52. The remaining portions of FIG. 3 are identical with those of FIG. 1 and accordingly, further description thereof will be omitted for the sake of brevity. In FIG. 3, a microcomputer is denoted by numeral 11.

The operation of the FIG. 3 arrangement will be discussed with reference to FIGS. 4 and 5 wherein hatched portions each indicate an uncertain logic state.

Figure 4:
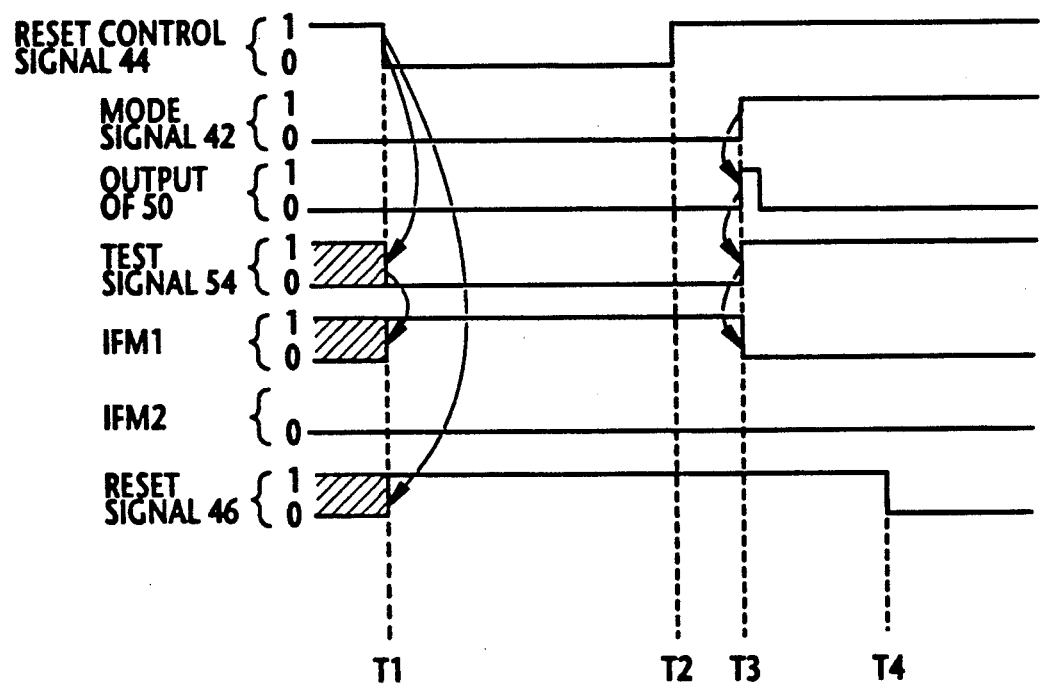
FIGS. 4 and 5 are timing charts which depict an example of the operations performed by the FIG. 3 arrangement.
Figure 5:
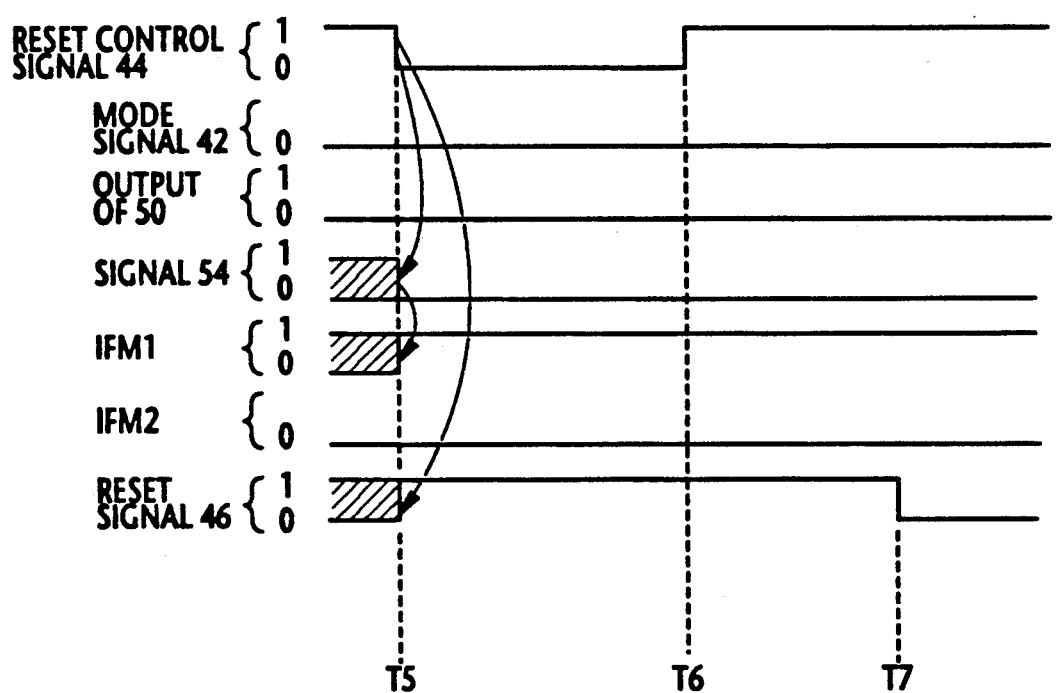

FIG. 4 is a timing chart showing FIG. 3 arrangement being pulled into the above-mentioned TEST MODE 1. It is assumed that: (a) the reset control signal 44 assumes a logic 0 at a time point T1 and (b) the mode signal 42 continues to assume a logic 0 at T1. Thus, the RS flip-flop 52 is reset and the output thereof (viz., test signal) 54 assumes a logic 0, while the reset signal 46 assumes a logic 1 (viz., power source voltage Vcc). Accordingly, the CPU 14 is reset by the reset signal 46 assuming a logic 1. At a time point T2, the reset control signal 44 assumes a logic 1, after which the reset signal 46 assumes a logic 0 a predetermined later time (T4). During the time points T2 and T4, the mode signal 42 assumes a logic 1 at a time point T3. Thus, the output of the leading edge detector 50 assumes a logic 1, in response to which the RS flip-flop 52 is set. Therefore, the test signal 54 assumes a logic 1 and the signal IFM 1 assumes a logic 0. Since the mode signal 42 assumes a logic 0 until T3 and the signal 54 assumes a logic 1 at T3, the signal IFM 2 also assumes a logic 0. This means that the usual microcomputer modes are suppressed. The test signal 54 assuming a logic 1 initiates TEST MODE 1 after the CPU 14 is released from the reset condition at T4.

One of the usual operation modes of the microcomputer 11 (viz., the operation mode activated by the signal IFM 1), will be described with reference to FIG. 5. In this instance, the mode signal 42 continues to assume a logic 0 and hence the output of the leading edge detector 50 also remains at a logic 0, as shown in FIG. 5. Under this condition, when the reset control signal 44 assumes a logic 0 at a time point T5 the RS flip-flop 52 is reset and thus the test signal 54 assumes a logic 0, and further the reset signal 46 assumes a logic 1 as mentioned above. On the other hand, the signal IFM 1 assumes a logic 1 in response to the reset signal 54, while the signal IFM 2 remains at a logic 0. Thereafter, the reset control signal 44 jumps to a logic 1 at a time point T6. As previously mentioned, the reset signal 46 assumes a logic 0 after a predetermined time duration at a time point T7 in order to release the reset condition of the CPU 14. Thus, the usual operation induced by the signal IFM 1 is initiated.

A second embodiment of the present invention will be discussed with reference to FIGS. 6 and 7.

Figure 6:
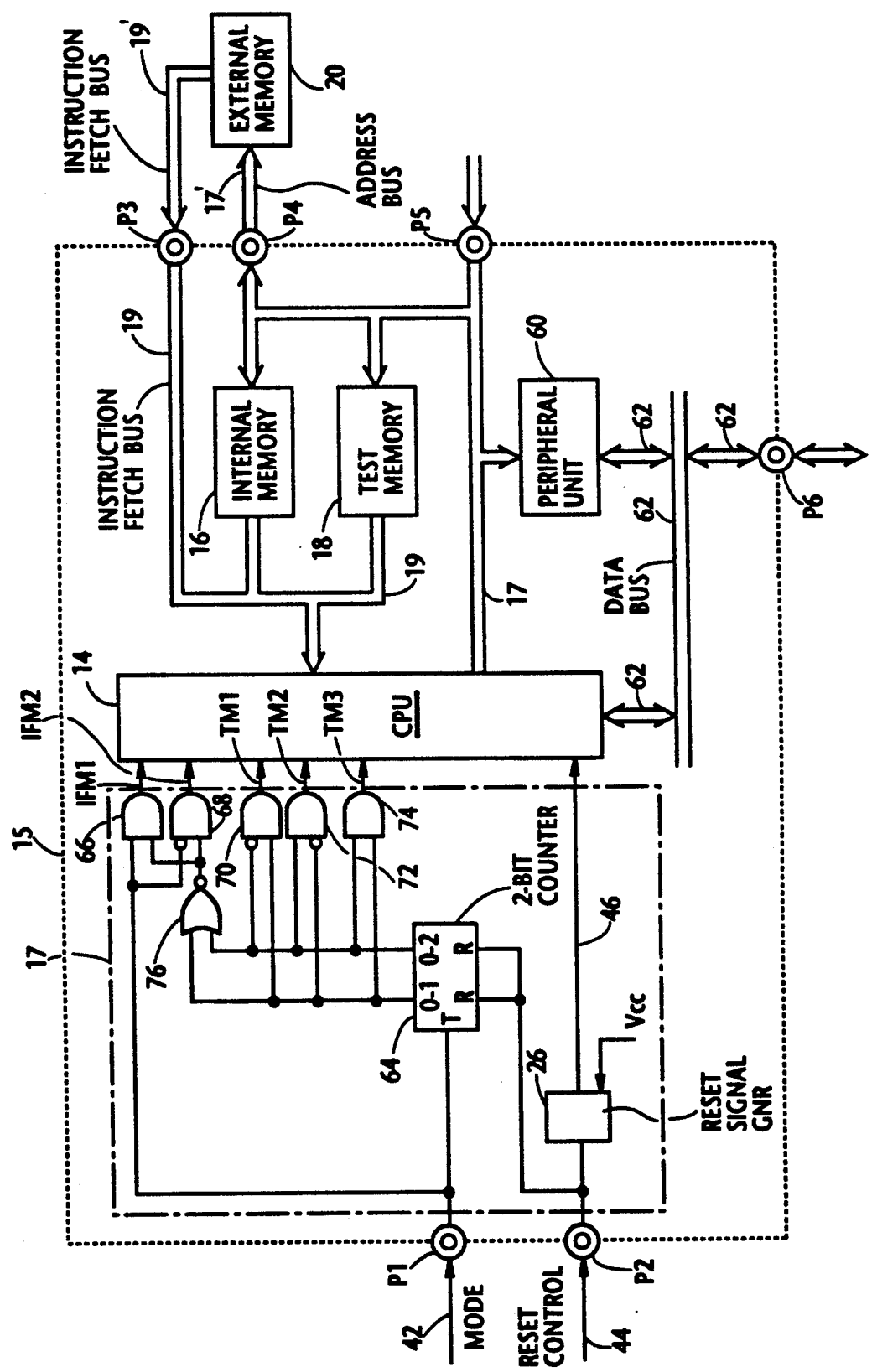
FIG. 6 is a block diagram showing a second embodiment of the present invention.
Figure 7:
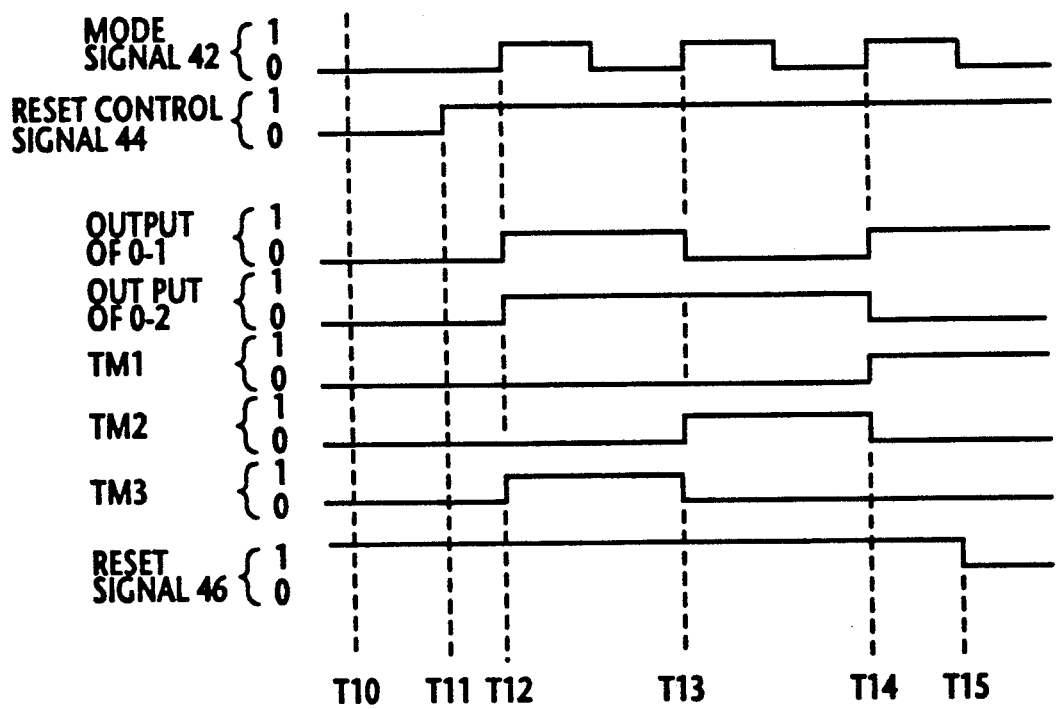
FIG. 7 is a timing chart which shows the timing with which events, which characterize the operation of the second embodiment, are carried out.

The arrangement of FIG. 6 differs from that of FIG. 3 in that the former arrangement further includes a peripheral unit 60 such as a timer. Further, a test mode setting circuit 17 of FIG. 6 is configured in a manner different from the counterpart thereof of FIG. 3. The peripheral unit 60 is coupled to a pin P5 via the address bus 17 and also to the CPU and a pin P5 via a data bus 62. On the other hand, the test mode setting circuit 17 includes a 2-bit counter 64, five AND gates 66, 68, 70, 72 and 74, an OR gate 76, and the reset signal generator 26 which is identical with the counterpart of FIG. 3. The 2-bit counter 64 is provided with an input terminal T and two output terminals 0-1 and 0-2.

The second embodiment is able to initiate three different test modes: TEST MODE 1 as mentioned in the opening paragraphs, TEST MODE 2 and TEST MODE 3. TEST MODE 2 is to dump the user's program stored in the internal memory 16, while TEST MODE 3 is to verify the operations of the peripheral unit 60. In TEST MODE 3, the CPU 14 ceases to operate wherein the input information for verification is applied to the peripheral unit 60 via the pin P5 while the outputs therefrom are derived from a pin P6. Since the instant invention is not directly concerned with TEST MODEs per se, further description thereof will be deemed redundant.

One of the usual microcomputer modes is selected depending on the mode signal 42 and the output of the OR gate 76. That is, when the mode signal 42 continues to assume a logic 0, the output appearing at each of the terminals 0-1 and 0-2 remains a logic 0. This means that the fetch mode signals IFM 1 and IFM 2 assume logic levels 0 and 1, respectively. On the other hand, when the mode signal 42 continues to assume a logic 1 (viz., there is no logic level change of the mode signal 42), the output appearing at each of the output terminals 0-1 and 0-2 also remains a logic 0. Thus, the fetch mode signals IFM 1 and IFM 2 in turn assume logic 1 and 0, respectively. In these cases, none of the three TEST MODEs 1-3 are selected.

The further operations of the FIG. 6 embodiment will be described with reference to the timing chart shown in FIG. 7.

The above-mentioned three TEST MODEs 1-3 are respectively carried out when the outputs of the AND gates 70, 72 and 74 (viz., TM1-TM3) assume logic 1s. It is assumed that the reset signal 46 takes a logic 1 at a time point T10. Thus, the CPU 14 is in the initialize condition. The reset control signal 44 resets the 2-bit counter 64 and hence each of the signals appearing at the outputs 0-1 and 0-2 of the 2-bit counter 64 assumes a logic 0. When the signal level of the mode signal 42 changes from a logic 0 to a logic 1 at time points T12, T13 and T14, it is clearly understood that the logic levels of test mode signals TM1-TM3 change as shown. As shown, when the CPU 14 is released from the initialize condition at a time point T15, the test mode signal TM1 assumes a logic 1 and thus, TEST MODE 3 is implemented.

In the event that TEST MODE 2 is wished to be implemented for example, two pulses of the mode signal 42 should be applied prior to T15.

While the foregoing description describes two embodiments according to the present invention, the various alternatives and modifications possible without departing from the scope of the present invention, which is limited only by the appended claims, will be apparent to those skilled in the art.

What is claimed is:

1. A test mode setting arrangement provided in a microcomputer which includes an internal memory and a central processing unit, said central processing unit accessing said internal memory or an external memory depending on a logic level of an external mode signal applied to said microcomputer, comprising:

first means for resetting said central processing unit in response to an external reset control signal applied to said first means;

second means for generating an output in response to a logic level change of said mode signal;

a flip-flop coupled to be reset by said reset control signal and coupled to receive said output of said second means, said flip-flop issuing an output which is applied to said central processing unit as a test mode initiating signal; and logic means coupled to receive said mode signal and said output of said flip-flop, said logic means preventing said central processing unit from accessing said internal and external memories when said flip-flop issues said test mode initiating signal, said logic means producing two signals which are applied to said central processing unit to select an access by said central processing unit to one of said internal and external memories when said flip-flop does not issue said test mode initiating signal.

2. A test mode setting arrangement as claimed in claim 1, wherein said logic means includes two logic gates each of which is coupled to receive said mode signal and said output of said flip-flop.

3. A test mode setting arrangement as claimed in claim 2, wherein said logic gates comprise:

a first AND gate connected to receive an inverted logic level of said mode signal and said output of said flip-flop, said first AND gate generating a first fetch mode signal; and a second AND gate connected to receive said mode signal and said output of said flip-flop, said second AND gate generating a second fetch mode signal.

4. A test mode setting arrangement provided in a microcomputer which includes an internal memory and a central processing unit, said central processing unit accessing said internal memory or an external memory depending on a logic level of an external mode signal applied to said microcomputer, comprising:

first means for resetting said central processing unit in response to an external reset control signal applied to said first means;

a counter being arranged to be reset by said reset control signal and issuing at least two outputs whose logic levels change in response to a logic level change of said mode signal; and logic means coupled to receive said mode signal and said outputs of said counter, said logic means producing a plurality of signals which are applied to said central processing unit to select one of plural test modes or to select an access by said central processing unit to one of said internal and external memories, depending on said mode signal and said outputs of said counter.

5. A test mode setting arrangement as claimed in claim 4, wherein said logic means includes a plurality of logic gates each of which is coupled to receive said outputs of said counter and generates an output which is coupled to said central processing unit.

6. A test mode setting arrangement as claimed in claim 5, wherein said microcomputer includes a peripheral unit and said logic gates comprise:
- an OR gate connected to receive said outputs of said counter and generating a combined output;
- a first AND gate connected to receive an inverted logic level of said mode signal and said output of said OR gate, said first AND gate generating a first fetch mode signal;
- a second AND gate connected to receive said mode signal and said output of said OR gate, said second AND gate generating a second fetch mode signal; and
- third, fourth and fifth AND gates each connected to receive said outputs of said counter to decode said counter outputs and generate first, second and third test mode signals, respectively, at least one of said test mode signals applied to said central processing unit causing said central processing unit to verify operations of said peripheral unit.

7. A test mode setting arrangement provided in a microcomputer which includes an internal memory, a plurality of pins and a central processing unit, said central processing unit accessing said internal memory or an external memory depending on a logic level of an external mode signal applied to said microcomputer, comprising:
- first means for resetting said central processing unit in response to an external reset control signal applied to said first means, said reset control signal and said mode signal having essentially identical maximum voltage levels;
- second means for generating an output in response to a logic level change of said mode signal, said output of said second means being applied to said central processing unit as a test mode initiating signal; and
- third means coupled to receive said mode signal and said output of said second means, said third means producing two signals which select an access by said central processing unit to one of said internal and external memories when said test mode initiating signal does not issue.

8. A test mode setting arrangement as claimed in claim 7 wherein said second means includes;
- a flip-flop coupled to be reset by said reset control signal, said flip-flop issuing an output which is applied to said central processing unit as said test mode initiating signal.

9. A test mode setting arrangement as claimed in claim 8, wherein the third means includes two logic gates each of which is coupled to receive said mode signal and said output of said flip-flop.

10. A test mode setting arrangement as claimed in claim 9, wherein said logic gates comprise:
- a first AND gate connected to receive an inverted logic level of said mode signal and said output of said flip-flop, said first AND gate generating a first fetch mode signal; and
- a second AND gate connected to receive said mode signal and said output of said flip-flop, said second AND gate generating a second fetch mode signal.

11. A test mode setting arrangement as claimed in claim 7 wherein the second means includes:
- a counter being arranged to be reset by said reset control signal and issuing at least two outputs whose logic levels change in response to a logic level change of said mode signal.

12. A test mode setting arrangement as claimed in claim 11, wherein said third means includes a plurality of logic gates each of which is coupled to receive said outputs of said counter and generates an output which is coupled to said central processing unit.

13. A test mode setting arrangement as claimed in claim 12, wherein said microcomputer includes a peripheral unit and said logic gates comprise:
- an OR gate connected to receive said outputs of said counter and generating a combined output;
- a first AND gate connected to receive an inverted logic level of said mode signal and said output of said OR gate, said first AND gate generating a first memory fetch mode signal;
- a second AND gate connected to receive said mode signal and said output of said OR gate, said second AND gate generating a second memory fetch mode signal; and
- third, fourth and fifth AND gates each connected to receive said outputs of said counter to decode said counter outputs and generate first, second and third test mode signals, respectively, at least one of said test mode signals applied to said central processing unit causing said central processing unit to verify operations of said peripheral unit.

* * * * *